United States Patent
Sharma et al.

(10) Patent No.: US 7,608,815 B2
(45) Date of Patent: Oct. 27, 2009

(54) PHOTO DETECTOR WITH COMPENSATED OUTPUT AND METHOD INVOLVING SAME

(75) Inventors: Pratibha Sharma, Victoria (CA); Gerald E. Kurz, Brentwood Bay (CA); Yong Jeong Cho, Victoria (CA); James A. Anderson, Brentwood Bay (CA); J. David T. Anderson, Brentwood Bay (CA); Gregory A. Jacklin, Saanichton (CA)

(73) Assignee: Streetlight Intelligence, Inc., Victoria, BC (CA)

( * ) Notice: Subject to any disclaimer, the term of this patent is extended or adjusted under 35 U.S.C. 154(b) by 30 days.

(21) Appl. No.: 11/476,498

(22) Filed: Jun. 28, 2006

(65) Prior Publication Data

US 2007/0001833 A1 Jan. 4, 2007

Related U.S. Application Data

(60) Provisional application No. 60/695,252, filed on Jun. 30, 2005, provisional application No. 60/695,627, filed on Jun. 30, 2005.

(51) Int. Cl.
*H01J 40/14* (2006.01)
(52) U.S. Cl. .................................... 250/238
(58) Field of Classification Search ............. 250/214 R, 250/214 C, 238, 214 AL, 214 LA
See application file for complete search history.

(56) References Cited

U.S. PATENT DOCUMENTS

| | | | |
|---|---|---|---|
| 3,705,316 A | 12/1972 | Burrous et al. | |
| 4,694,157 A | 9/1987 | Mishina | |
| 4,758,767 A | 7/1988 | Blake | |
| 5,055,669 A | 10/1991 | Blake et al. | |
| 5,266,792 A | 11/1993 | Crowne et al. | |
| 5,382,785 A * | 1/1995 | Rink | 250/205 |
| 5,446,277 A | 8/1995 | Rutter | |
| 5,715,045 A * | 2/1998 | Dunne | 356/28 |
| 5,796,291 A | 8/1998 | Mattes et al. | |
| 5,883,830 A | 3/1999 | Hirt et al. | |
| 5,929,982 A * | 7/1999 | Anderson | 356/73.1 |
| 5,990,628 A * | 11/1999 | Birrell | 315/151 |
| 6,191,408 B1 * | 2/2001 | Shinotsuka et al. | 250/208.1 |
| 6,693,394 B1 | 2/2004 | Guo et al. | |
| 6,852,966 B1 | 2/2005 | Douma et al. | |
| 7,060,970 B2 * | 6/2006 | Cheung et al. | 250/238 |
| 7,098,443 B2 * | 8/2006 | Tan et al. | 250/226 |
| 7,256,378 B2 * | 8/2007 | Furukawa et al. | 250/208.1 |
| 2001/0023944 A1 * | 9/2001 | Maruyama et al. | 257/53 |
| 2004/0067060 A1 * | 4/2004 | Aronson et al. | 398/135 |
| 2004/0069929 A1 * | 4/2004 | Furukawa et al. | 250/208.1 |

* cited by examiner

FOREIGN PATENT DOCUMENTS

JP 9-304494 11/1997

OTHER PUBLICATIONS

English abstract(AD), Nov. 28, 1997, Yonezawa et al.

*Primary Examiner*—Georgia Y Epps
*Assistant Examiner*—Kevin Wyatt
(74) *Attorney, Agent, or Firm*—Charles W. Bethards

(57) ABSTRACT

A method of compensating a photo sensor (and a corresponding photo sensor with compensation) insures the accuracy of the photo sensor, e.g., over environmental variations or photo cell variations. The method comprises: providing a first signal indicative of a light level; providing a second signal indicative of an environmental parameter, e.g., temperature; and calculating, responsive to the first signal and the second signal, a compensated signal that is indicative of an absolute light level. The calculating can be performed by a processor and utilize calibration and compensation information or parameters, which can be obtained experimentally.

30 Claims, 4 Drawing Sheets

PHOTO DETECTOR WITH COMPENSATED OUTPUT AND METHOD INVOLVING SAME

RELATED APPLICATIONS

This application claims priority from Provisional Application, Ser. No. 60/695,252, filed on Jun. 30, 2005 and Provisional Application, Ser. No. 60/695,627, filed on Jun. 30, 2005, which are each hereby incorporated herein in their entirety by reference.

FIELD OF THE INVENTION

This invention relates in general to photo sensors and compensation of such photo sensors and more specifically to techniques and apparatus for applying compensation to signals obtained from a photo cell used in a photo sensor.

BACKGROUND OF THE INVENTION

Photocells and associated circuitry (photo sensor) for converting light levels into an electrical signal are known. Photo sensors are used, for example, to control street lights and the like such that the lights are turned off during day time and on at night.

Photo sensors and specifically photocells come in various technologies, e.g., Silicon and Cadmium Sulphide. Cadmium Sulphide based sensors or cells are typically available as light dependent resistors that advantageously resemble a human eye response to light, however suffer from an irreversible drift with temperature and thus have not been used in situations that require repeated operation, i.e., light detection. Silicon based sensors or cells are available as photo diodes and photo transistors. Photo transistors typically demonstrate better sensitivity with larger output signals available for a given light input. Silicon sensors also have a long life expectancy (tens of years) which is typically required or very desirable in most lighting situations.

Silicon cells or sensors while having long life expectancies and good sensitivities and being available in small sizes have various problems. For example, these cells are known to vary with temperature and from one cell to another. These variations are not acceptable in some situations where accurate light levels are required. One technique, for overcoming variations due to temperature is to control the temperature of the photo cell, however controlling temperature comes with its own set of difficulties, e.g., hardware costs in terms of size and economics.

BRIEF DESCRIPTION OF THE DRAWINGS

The accompanying figures where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION

Figure 1:
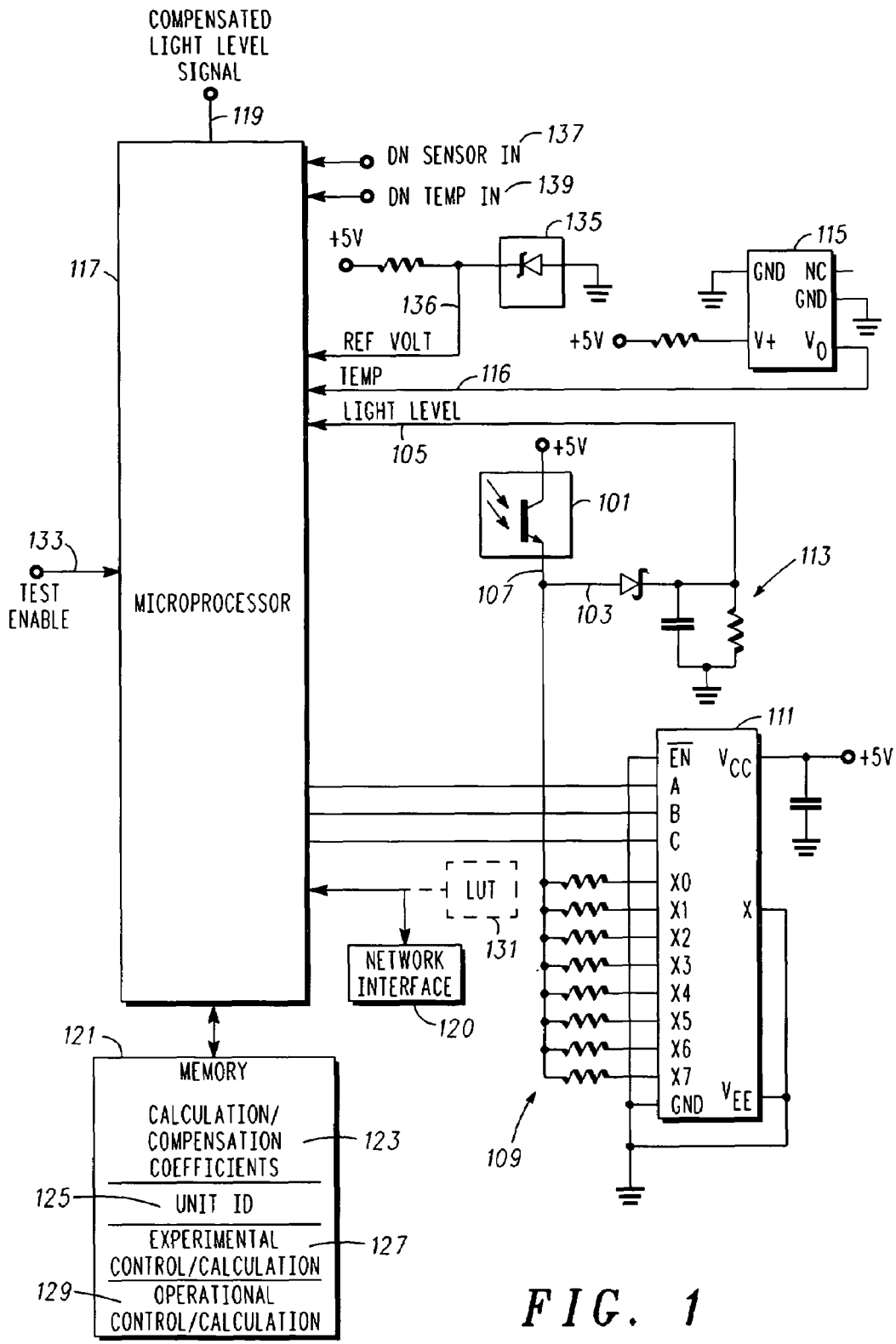
FIG. 1 depicts in a simplified and representative form, a high level block diagram of a photo sensor with compensation in accordance with one or more embodiments.

In overview, the present disclosure concerns accurate light level sensing using, e.g., a photo sensor, and more specifically techniques and apparatus for compensating such photo sensors and associated photo cells for device and assembly variations as well as environmental variations in order to provide accurate light level readings. The photo sensors are typically arranged and constructed for facilitating control of other systems, e.g., lighting systems and the like, where ambient light levels or actual light levels, e.g., from an associated lamp or the like, may be used pursuant to control of the associated system. More particularly various inventive concepts and principles embodied in methods and apparatus, for determining or utilizing compensation parameters or coefficients to provide a compensated signal indicative of an actual or absolute light level will be discussed and disclosed.

The systems of particular interest may vary widely but include outdoor and indoor lighting systems or any other system where ambient or generated light levels and accurate indications thereof can be advantageously used to enhance and improve control of these systems. In systems, equipment and devices that employ photo sensors and associated photo cells, e.g., street lighting or other lighting systems, light level sensing apparatus and methods can be particularly advantageously utilized, provided they are practiced in accordance with the inventive concepts and principles as taught herein to provide accurate light level indications that have been compensated for device and environmental variations.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms, if any, such as first and second, top and bottom, and the like are used solely to distinguish one from another entity or action without necessarily requiring or implying any actual such relationship or order between such entities or actions.

Much of the inventive functionality and many of the inventive principles are best implemented with or in integrated circuits (ICs) including possibly application specific ICs or ICs with integrated processing controlled by embedded software or firmware. It is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation. Therefore, in the interest of brevity and minimization of any risk of obscuring the principles and concepts according to the present invention, further discussion of such software and ICs, if any, will be limited to the essentials with respect to the principles and concepts of the various embodiments.

Referring to FIG. 1, a simplified and representative high level block diagram of a photo sensor with compensation in accordance with one or more embodiments will be briefly discussed and described. In FIG. 1, a photo sensor that includes various circuitry to facilitate compensation of a photo cell 101 is shown. This photo sensor can be packaged in an environmentally resistant package and installed together with a controlled element. For example in a lighting system, the photo sensor can be installed together with other circuitry, lamps, etc. in a luminaire as a street light or stadium light, parking lot light, or other lighting fixture.

The photo sensor with compensation comprises the photo cell 101 that is arranged, constructed, or configured for providing a first signal at 103, 105 that is indicative of a light level that is input to or incident on the photo cell. Various photo cells fashioned from various technologies and available via various providers could be used. In one embodiment a Silicon based photo transistor from Osram, designated SFH-3410, has been characterized and used with satisfactory results. The photo cell 101 is coupled to a supply voltage, shown here as a 5 volt supply, and includes an output terminal 107 where a current proportional to the incident or input light level is provided. It will be appreciated that the indicated light level available from a photo cell or photo sensor can vary from an absolute light level as the result of variations in the particular photo cell, or photo sensor (e.g., packaging including amount of and translucency of any weather resistant coatings, temperature, dust accumulation, etc.). In applications where reasonable accuracy is required in determining an absolute (real or actual) light level using such a photo sensor, compensation (adjustment of the indicated light level) may be required to provide the necessary accuracy.

The current at 107 is coupled to a resistive network 109, where this network is selectively configured, e.g., different resistor values are chosen via a multiplexer 111, to adjust or control a voltage range of the first signal. It will be appreciated that a variable gain circuit could alternatively be utilized in place of the resistive network. Controlling the voltage range includes setting a lower voltage level and thus higher voltage level for a given range of input light levels for a corresponding photo sensor, which facilitates using an analog to digital converter (ADC) to convert the first signal to a digital first signal. The first signal at 103 (voltage) is coupled to a peak detector 113 comprising a series diode and parallel resistor capacitor all as shown. In one embodiment a low threshold diode, e.g. a Schottky diode with a turn on voltage around 0.3 volts, a resistor with a relatively high value, e.g., in one embodiment near 1 Mega ohm, and relatively physically small and long useful life capacitor, e.g., 10 micro farad ceramic capacitor, were used for the peak detector 113.

Further included in the photo sensor with compensation of FIG. 1 is an environmental sensor that is configured to provide a second signal indicative of an environmental parameter. The environmental sensor in various embodiments comprises a temperature sensor, e.g., LM20 available from National Semiconductors, configured to provide the second signal indicative of an ambient temperature. Temperature is one environmental variable that can change dramatically in, e.g., street lighting applications. For example, street lights can include a day night sensor that is typically deployed outside of a luminaire and thus will be exposed to the extremes of hot and cold over many seasons and in various geographical locations from near polar conditions to equatorial conditions. Lighting fixtures or luminaires can also include a lamp sensor that is typically disposed internal to the luminaire where ambient temperature vary from near the external ambient temperature and rise dramatically as the associated lamp is operational. Other environmental sensors that can be employed include a dust accumulation sensor, humidity sensor, or the like, that can change an indicated light level signal or that can be used together with a light level signal pursuant to control of an associated system. The temperature sensor 115 provides an output voltage with a known relationship to an ambient temperature surrounding the sensor. This relationship is typically available from the manufacturers' data sheet. For example, for Silicon-based analog output temperature sensors, Temperature may be given by an equation of the form:

Temperature(Deg.C.)=To−(DC offset at 0° C.)/TemperatureCoefficient(mV/°C)

where To is the voltage reading provided by the sensor. More specifically, for the LM20 sensor:

Actual temperature(deg C.)=(To−1.8663)/(−11.69 mv/Deg C.)

Additionally included in the photo sensor with compensation of FIG. 1 is a processor 117 that is coupled and responsive to the first signal 103 and the second signal, e.g., temperature 116 and configured to provide a compensated signal or compensated light level signal at 119 that is indicative of a calibrated or an absolute light level. It will be appreciated that the compensated light level signal or value, shown at 119, rather than being available at an output of the processor, can be provided to a network interface 120 (radio, wired, power line, phone line, etc. based network) and thus other entities or provided to other functions or processes operating within or being performed by the processor 117. As shown, the processor includes a memory 121 that can be integral or external to the processor 117. The memory 121 is used to store software routines and various data as well as general operating system that when executed and utilized by the processor 117 result in the processor performing the various functions as further explained herein. It will be appreciated that the processor can perform additional functions other than those that will be further described below. The memory is shown with a calibration and compensation coefficients 123, unit identifier information 125, experimental and testing control and calibration routines 127 as well as operational control and calculation routines 129. Each of these will be described below.

More specifically, the processor 117 in some embodiments is further configured to provide the compensated signal dependent on an environmental parameter, e.g., dependent on ambient temperature as indicated by the temperature sensor 115 and the light level as indicated by the photo cell 101. This and other operations of or processes executed by the processor are controlled by the operational control and calculation routines 129. One of ordinary skill given a particular processor and the discussions herein can readily develop such routines without undue experimentation and thus the particular software routines will not be further discussed.

In some embodiments, the photo sensor of FIG. 1, specifically processor 117 includes or has access to a look up table (LUT) 131 and the processor is further configured to access the LUT to facilitate providing the compensated signal. It will be appreciated that the LUT, for example, can be a part of memory 121 or integral with the processor 117 or can be remotely located and accessed via the network interface 120. In many instances, the processor accesses the look up table in accordance with an index (pointer, address, etc) that depends on the first signal or the second signal and when the LUT is remotely situated, the processor may use the Unit ID 125 to access the appropriate LUT. As an example, the processor can read the first signal, e.g., a light level, as well as the second signal, e.g., a temperature indication, access the LUT for the particular photo sensor at an address or via a pointer that depends on the temperature indication and light level, and retrieve from the LUT a value indicative of the real or absolute light level given the particular photo sensor, the light level as read or indicated and the temperature indication.

In other embodiments, the photo sensor, specifically the processor 117 is further configured to calculate the compensated signal based at least on one or more of the first signal 103 and the second signal 116. The processor in various embodiments adjusts the first signal (e.g., indicated light level) to account for a sensitivity of the photo cell relative to the light level. As will be further discussed below, the processor as part of an initial factory phasing or calibrations procedure or provisioning procedure prior to deployment can be tested or evaluated as facilitated by the experimental control and calibration routines 127 to assess the sensitivity of the photo sensor given the particular photo cell and other assembly variables. This testing, calibrating, or provisioning process can be enabled or entered by providing a corresponding signal at 133 to the processor. Note the input at 133 is also representative of a programming input that allows various data and software routines to be loaded into the photo sensor, specifically processor as needed.

Essentially by placing the photo sensor in a calibrated or known environment with a known or calibrated light level, an indicated light level can be related to the known light level. By taking a plurality of measurements at different light levels with other variables (temperature, etc) held constant a relationship between actual and indicated light level can be determined. In some embodiments, where Silicon based photo sensors are utilized a straight line relationship provides a good model and often the intercept of this line is near zero. Thus in some embodiments, the processor adjusts the first signal in accordance with a light calibration coefficient and a calibration constant associated respectively with the slope and intercept of a line relating the first signal and the light level when the second signal is constant. Note that the calibration coefficients and constants can be stored in the memory in the calibration/compensations coefficients area 123 or can be stored at a remote site and retrieved by the processor using the network interface 120 and unit identification information 125.

In some embodiments the photo sensor, specifically the processor is configured to and adjusts the first signal 103 to account for a sensitivity of the photo cell 101 relative to temperature, where the temperature is indicated by the second signal. In certain embodiments, the processor adjusts the first signal in accordance with one or more temperature coefficients associated with a function relating the first signal to the temperature when the light level is constant to provide a temperature compensated signal. In some situations, the processor then adjusts the temperature compensated signal in accordance with a light calibration coefficient (see above) to provide the compensated signal that indicates or is indicative of the absolute light level. One detailed approach for compensating, calibrating or adjusting an indicated light level to provide a real, actual or absolute light level will be described below.

In many embodiments, the photo sensor of FIG. 1 operates on digital data points and appropriate processors, e.g., ATMEGA128L available from Atmel Corporation of San Jose, Calif., include analog to digital converters (ADCs) to facilitate this operation. Thus the photo sensor further comprises one or more ADCs configured to convert the first signal and the second signal to, respectively, a first digital value and a second digital value. This is facilitated by providing the processor a reference from a voltage reference 135. In one or more embodiments the reference voltage 136 is 3.3 volts and the resultant digital values, hereafter referred to as ADC values, cover a range from 0 to 1023 with each ADC unit approximately=3.3 mV. As noted above, the range of the first digital values is controlled using the resistive circuit or network 109 coupled to the photo cell as selectively configured via the multiplexer 111 which is controlled from the processor 117 to set a range for the first signal. This range is set to be approximately 3.3 volts (i.e., the reference voltage) over expected light levels.

The processor 117 can also include a day night sensor input (DN SENSOR IN 137) and a day night temperature input (DN TEMP IN 139). These are inputs from a day night sensor where this sensor is similar to the photo cell 101 and peak detector 113 and the temperature input is provided by a temperature sensor that is similar to the temperature sensor 115. As noted above, the day night sensor is likely situated differently (external to luminaire with external ambient temperatures) than the photo or lamp sensor that is detailed in FIG. 1. However the principles and concepts discussed and described herein for calibration or compensation of the photo or lamp sensor will apply to the day night sensor.

Figure 2A:
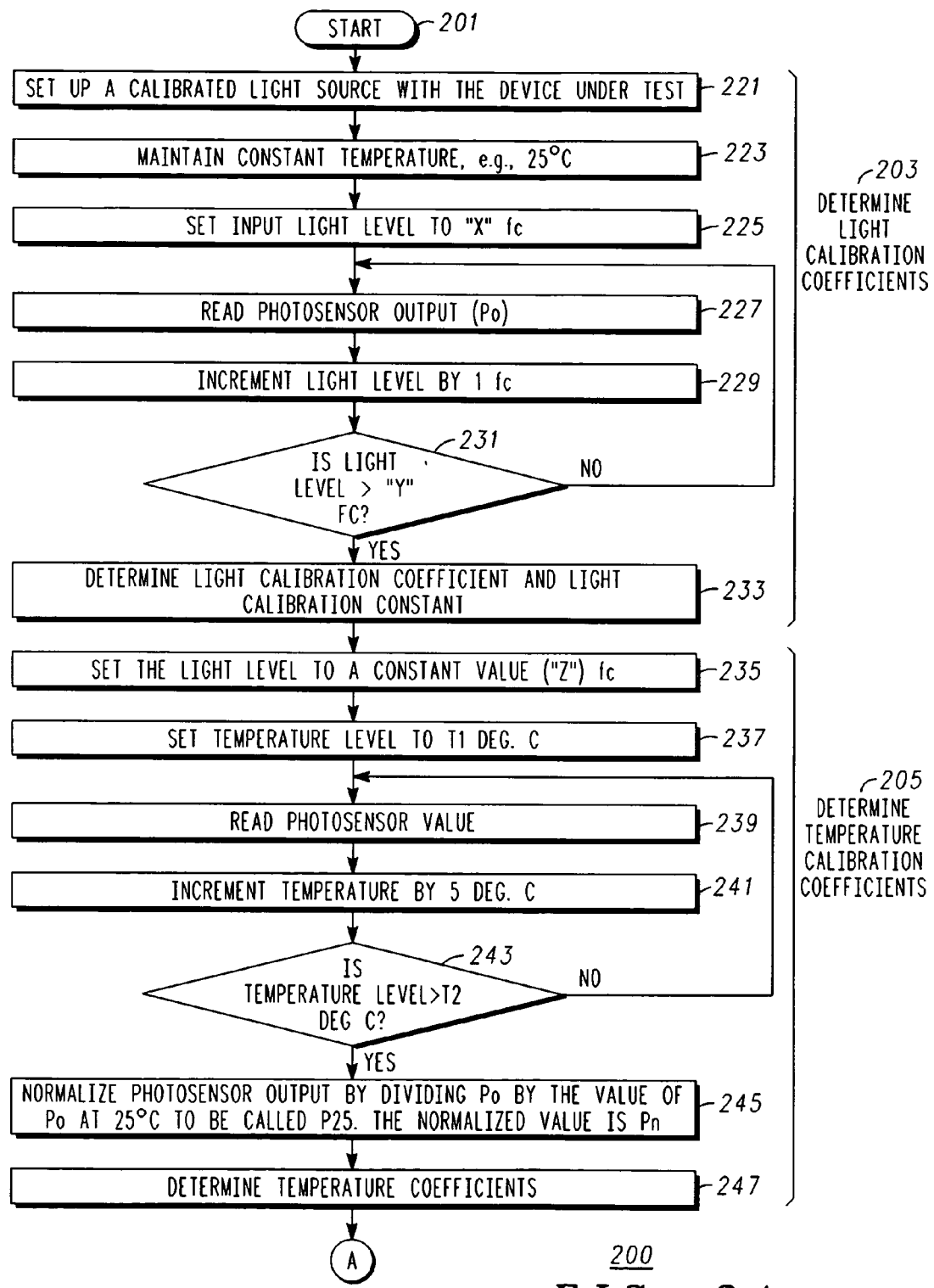
FIGS. 2A and 2B in a representative form, shows a flow chart illustrating methods of obtaining parameters for compensation of a photo sensor in accordance with one or more embodiments.
Figure 2B:
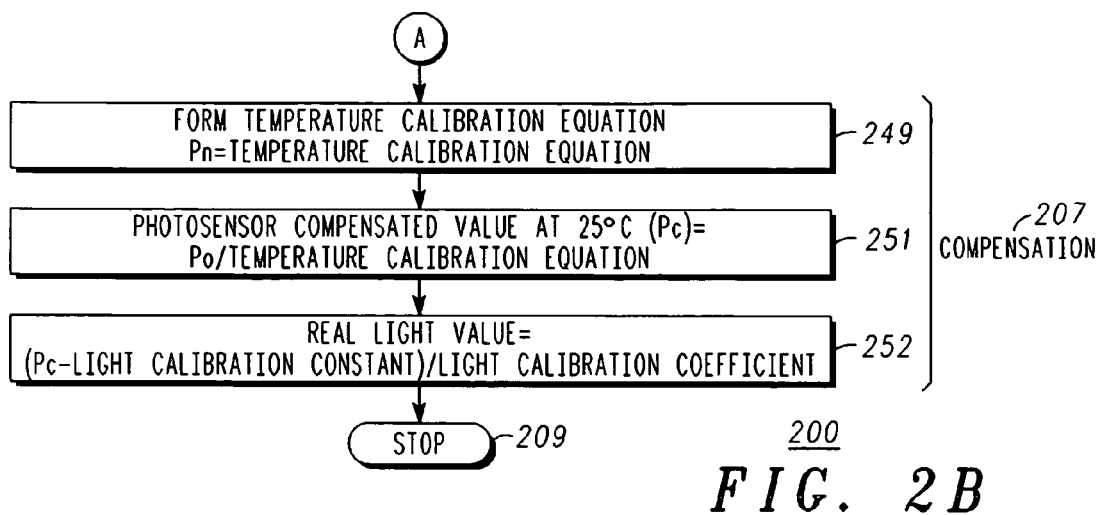

Referring to FIGS. 2A and 2B, a representative flow chart 200 illustrating methods of obtaining parameters for compensation of a photo sensor in accordance with one or more embodiments will be briefly discussed and described. FIG. 2 shows the flow chart 200 which starts at 201 and comprises a series of processes 203 that determine one or more light calibration coefficients followed by a series of processes 205 that determine one or more temperature coefficients. A final series of processes 207 illustrate utilization of these coefficients to compensate or adjust a given light level indication such that the compensated light level is representative of a real or absolute light level with the flow chart then ending 209. The methods of FIG. 2A can be repeated as warranted and generally will be executed at least in part for each photo sensor as a part of manufacturing or deploying the photo sensor used as a lamp sensor or as a day night sensor. The methods can be practiced using the photo sensor of FIG. 1 or similarly configured sensors executing experimental control and calibration routines.

In part the flow chart of FIG. 2A illustrates a method of determining parameters for compensation of a photo sensor, where the method includes, after setting up in a generally known manner a calibrated light source and the device, e.g., photo sensor, under test 221, controlling or maintaining 223 a temperature of the photo sensor to, e.g., 25 degrees C.; varying an input light level to the photo sensor to provide first indications of the light level with each of the first indications corresponding to a respective one of a plurality of light levels. Specifically the input light level is set 225 to a first level, e.g., 1 foot candle, the photo sensor output Po is read, the light level is incremented by, e.g., 1 foot candle 229, the light level is compared to an upper level Y 231, e.g., 12 foot candles, and the reading Po 227 and incrementing 229 is repeated until Y is reached 231. Then determining one or more light calibration coefficients based on the first indications of the light level is performed 233.

The relationship for Si photo cells to light level is reasonably linear and for the ease of calculation can be assumed to be a straight line at a constant temperature:

$$Po = mx + c$$

Where Po is the output of the photo sensor, x is the input light level in foot candles to the photo sensor In order to determine the value of m and c, two-points can be chosen ($x_1$, $Po_1$, and $x_2$, $Po_2$) and the values can be determined as $$m = \frac{Po_2 - Po_1}{x_2 - x_1}$$

and c is the value of Po when x=0. Thus the determining one or more light calibrations coefficients further comprises determining a light calibration coefficient corresponding to a slope of a line between two or more of the first indications and a light calibration constant corresponding to an intercept of the line. The slope m can be defined as the light calibration coefficient and c as the calibration constant. As noted above c is often small enough that it can be assumed to be 0.

The method in various embodiments further includes after setting or controlling the input light level to a constant value Z 235, e.g., 5 foot candles, varying the temperature of the photo sensor to provide second indications of the light level with each of the second indications corresponding to a respective one of a plurality of temperatures. More specifically, the temperature is set to T1 237, e.g., 0 degrees C., the photo sensor output Po is read 239, the temperature is incremented 241 by e.g., 5 degrees C., and compared to an upper limit T2 243, e.g., 85 degrees C. The reading the sensor output Po 239 and incrementing temperature 241 is repeated until the upper limit is reached as determined at 231. Then determining one or more temperature coefficients based on the second indications of the light level is undertaken 245, 247. Initially normalizing the second indications in accordance with the second indication obtained at a known temperature corresponding to the controlling the temperature is performed and then the determining the one or more temperature coefficients is based on the second indications as normalized. Specifically in some embodiments the photo sensor output is normalized 245 by dividing each Po by the value of Po at a given temperature, e.g., 25 degrees C. (P25). Then the temperature coefficients are determined at 247.

More particularly, the one or more temperature coefficients as determined define a temperature calibration equation to facilitate temperature compensation of any indication of a light level. For the relationship between light output and temperature for Silicon-based photo sensors, a polynomial equation has been found to provide a reasonably accurate model. In order to determine this equation, the normalized photo sensor outputs are used. Once the data points Po are collected and normalized (designated Pn), the relationship between the normalized data points can be determined with the help of a curve fitting method, e.g., the least-squares method as generally known. For a reasonable range of temperatures, a quadratic form of a temperature Calibration or compensation equation can be used, i.e., an equation of the form:

$Pn = dt^2 + et + f$ where Pn is the Normalized photo sensor output, t is temperature, and d, e and f are the coefficients of the least-squares approximation for fitting the normalized data points to the quadratic equation. It will be appreciated that as little as 3 data points or couples (Po and t) are required to find d, e, and f where d, e, and f are the temperature coefficients that can be used to compensate a light level indication for a particular temperature. Note that f=normalized light level when t=0.

Referring to FIG. 2B, a brief description of compensating a given Po at a given temperature is shown. Given d, e, and f, as well as a temperature, the temperature calibration or compensation equation is evaluated by substituting these values to provide a value for Pn 249. A light level Po from the photo sensor as temperature compensated (Pc) is found or calculated by dividing the light level Po by the temperature calibration equation as evaluated for the given temperature, i.e., Pc=Po/temperature calibration equation as evaluated 251. Thus any light level Po can be temperature compensated. The any indication of a light level as temperature compensated is further calibrated to provide a calibrated or real light level. In some embodiments this is done in accordance with the one or more light calibration coefficients which were determined as a slope of a line between two or more of the first indications and a light calibration constant corresponding to an intercept of the line. Specifically given the calibration coefficients or calibration coefficient and calibration constant as well as Pc (Po as temperature compensated) the absolute or actual or real light level is found by subtracting the calibration constant from Pc and dividing the result by the calibration coefficient 252.

Figure 3:
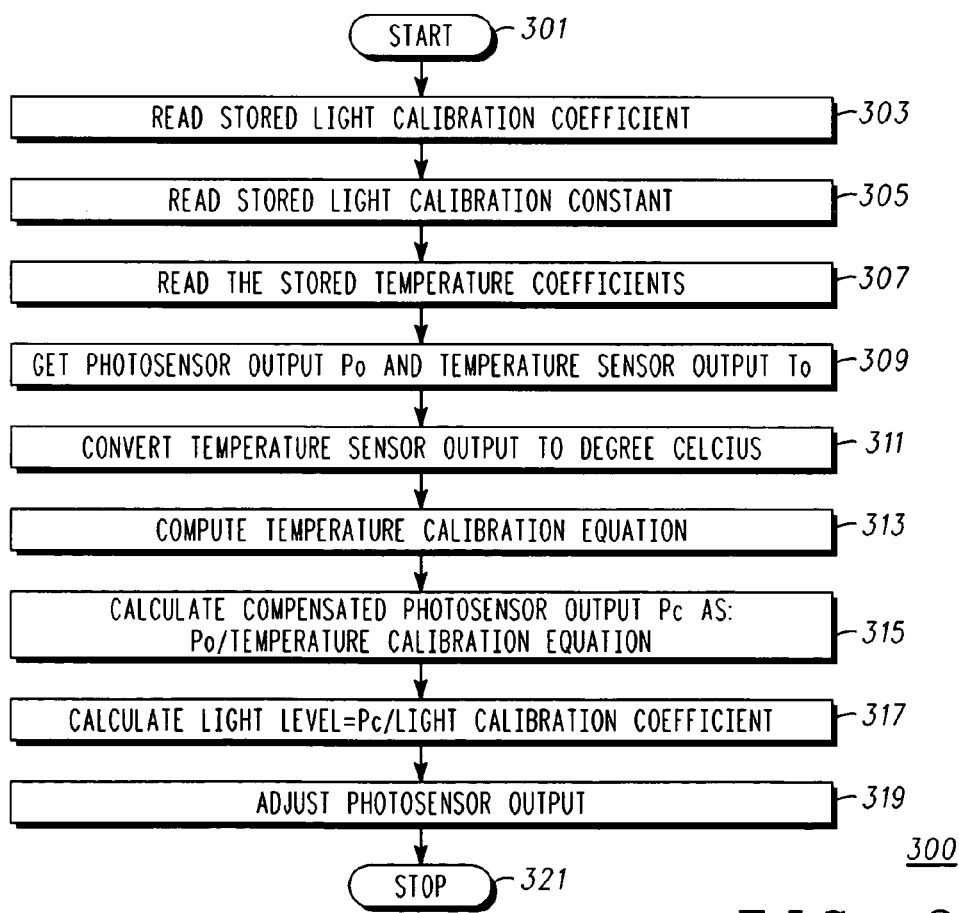
FIG. 3 in a representative form, shows a flow chart illustrating general methods of compensating an output of a photo sensor to provide a calibrated light reading in accordance with one or more embodiments.

Referring to FIG. 3, a representative flow chart 300 illustrating general methods of compensating an output of a photo sensor to provide a calibrated light reading in accordance with one or more embodiments will be discussed and described. FIG. 3 shows methods that facilitate compensating a photo sensor output from a given photo sensor once the experimental efforts discussed above have been performed and the calibration coefficient and constant as well as temperature compensation coefficients have been determined and stored for the given photo sensor. In some embodiments, a method of compensating an output of a photo sensor to provide a calibrated light reading comprises obtaining one or more light calibration coefficients (calibration coefficient 303 and calibration constant 305) and one or more temperature coefficients 307 all corresponding to the photo sensor. These coefficients can be obtained from experimental or calibration results as discussed above. The coefficients can be stored in and read from a memory that is integral with the photo sensor, e.g., part of the associated processor, or in a memory that is remote from the photo sensor and accessed via the network interface 120.

The method further includes getting a light output indication for the photo sensor and a temperature indication from a temperature sensor included with the photo sensor 309. Additionally the method includes calculating the calibrated light reading based on the one or more temperature coefficients and the one or more light calibration coefficients, the temperature indication, and the light output indication. In some embodiments, the calculating the calibrated light reading further comprises calculating a first compensated light output indication based on an equation corresponding to the one or more temperature coefficients. As shown in the flow chart, the calculating the calibrated light reading further comprises converting the temperature indication to a temperature 311 and then computing a temperature calibration equation given the temperature 313. Given the value from the temperature calibration equation, 325 calculates the first compensated light output or compensated photo sensor output by dividing the light output indication from 309 by the resultant value for the temperature calibration equation 313.

At 317, calculating the calibrated light reading further comprises calculating the calibrated light reading based on the first compensated light output indication Pc from 315 and the one or more light calibration coefficients. Specifically in one or more embodiments, the calibrated or actual light level is (Pc−calibration constant)/(calibration coefficient) 317. The photo sensor output Po can then be adjusted to the calibrated light level 319 and the method of FIG. 3 ends 321. Note the method can be repeated as needed for additional photo sensor light level outputs and as ambient or sensed temperature changes. This method is appropriate for implementation in the photo sensor of FIG. 1 for providing calibrated or actual light level readings or indications from a lamp sensor or from a day night sensor or other similarly arranged photo sensors and the like.

Figure 4:
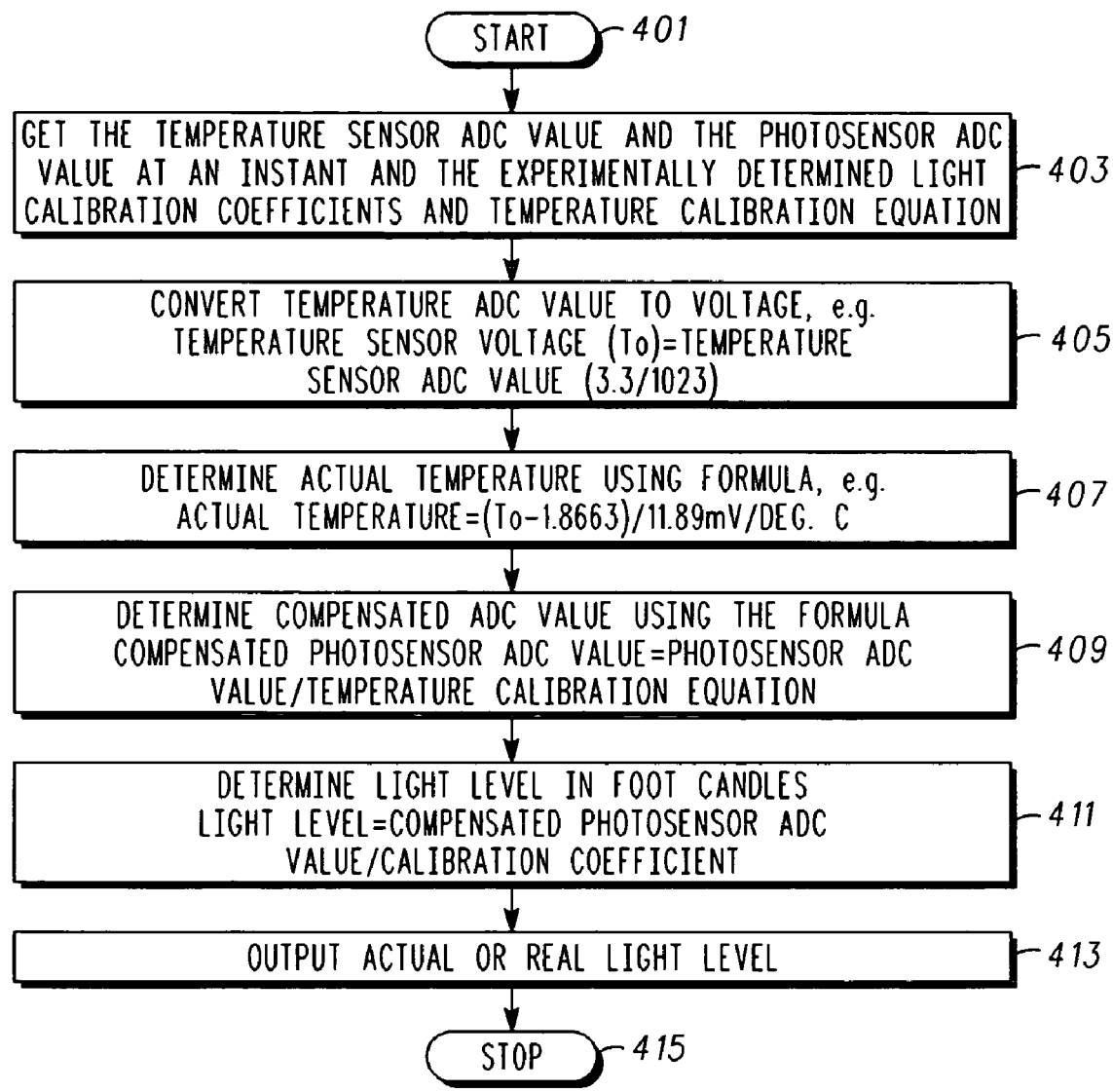
FIG. 4 in a representative form, shows a flow chart illustrating more particular methods of compensating a photo sensor to provide a calibrated light reading in accordance with one or more embodiments.

Referring to FIG. 4, a representative flow chart 400 illustrating more particular methods of compensating a photo sensor to provide a calibrated light reading in accordance with one or more embodiments will be discussed and described. FIG. 4 illustrates various methods for use in a photo sensor that uses digital values for the light level indications and temperature indications. This method begins at 401 and then shows getting a temperature sensor ADC value, a photo sensor ADC light output value, and the light calibration coefficients and temperature compensation coefficients, i.e., temperature calibration equation 403. Next the temperature ADC value is converted to a voltage reading 405. This is accomplished by multiplying the temperature ADC value by a factor indicative of the voltage represented by each digital step. In one embodiment this is 3.3 mV and the total range is 3.3. volts with 1023 steps. Thus To (temperature sensor voltage)=temperature sensor ADC value (3.3/1023) mV. The temperature sensor voltage (To) is then converted to degrees Celsius 407 using a formula corresponding to the temperature sensor that is being used, where the formula is normally available from the manufacturer of the sensor. In one embodiment, the actual temperature in degrees C. is found using the equation shown at 407.

The temperature compensated photo sensor ADC value is found at 409 and is given by dividing the photo sensor ADC value by the temperature calibration equation evaluated at the temperature that was found at 407. The light level in foot candles is found at 411 and is given by dividing the compensated photo sensor ADC value by the calibration coefficient (note this assumes the calibration constant is or is near zero and thus can be ignored, otherwise the constant would need to be subtracted with the result divided by the coefficient). The real light level is provided at 413 and the method ends at 415.

Referring back to FIG. 1 it will be appreciated that FIG. 1 and other sensor apparatus with similar functionality is suitable for implementing various methods of compensating one or more photo sensors and associated photo cells. It will be appreciated that the methods uses many of the inventive concepts and principles discussed in detail above and thus this description will be somewhat in the nature of a summary with various details generally available in the earlier descriptions. This method can be implemented in one or more of the structures or apparatus described earlier or other similarly configured and arranged structures.

In summary various embodiments include a method of compensating a photo sensor, where the method includes providing a first signal indicative of a light level and a second signal indicative of an environmental parameter. Then calculating, responsive to the first signal and the second signal, a compensated signal that is indicative of an absolute light level. In one exemplary embodiment, the providing a second signal comprises providing the second signal indicative of an ambient temperature and the calculating the compensated signal is dependent on the ambient temperature as indicated, e.g., by a temperature sensor and the light level as indicated, e.g., by a photo cell. The calculating can include accessing a look up table to facilitate providing the compensated signal and the accessing the look up table can be in accordance with an index that depends on one or more of the first signal and the second signal.

The calculating the compensated signal is normally based at least on one or more of the first signal and the second signal and can comprise adjusting the first signal to account for a sensitivity of a photo cell relative to the light level. The adjusting the first signal can comprise adjusting the first signal in accordance with a light calibration coefficient and a calibration constant associated respectively with the slope and intercept of a line relating the first signal and the light level when the second signal is constant.

The calculating the compensated signal can also comprise adjusting the first signal to account for a sensitivity of a photo cell relative to temperature, where the temperature is indicated by the second signal. The adjusting the first signal can comprise adjusting the first signal in accordance with one or more temperature coefficients associated with a function relating the first signal to the temperature when the light level is constant to provide a temperature compensated signal. The adjusting the first signal can also comprises adjusting the temperature compensated signal in accordance with a light calibration coefficient to provide the compensated signal that is indicative of the absolute light level.

In some embodiments, the providing the first signal and providing the second signal can include converting the first signal and the second signal to a, respective, first digital value and second digital value. A range of the first digital value can be controlled using a resistive circuit that is selectively configured and coupled to a photo sensor to set a range for the first signal.

The processes, apparatus, and systems, discussed above, and the inventive principles thereof are intended to and can alleviate erroneous light level indications at lower overall costs than prior art techniques. Using these principles of characterizing a photo sensor to provide various compensation and calibration information and using an associated processor to provide a compensated (actual) light level indication can quickly yield an accurate indication of light levels with relatively minimal costs and the like. It will be appreciated that these concepts and techniques can be applied to a lamp sensor or a day night sensor and the concepts and principles allow the determination of any one of a multitude of differing light levels. Accurate light levels can in turn be used for accurate control of lighting systems over any one of the multitude of light levels, thus saving power while providing appropriate lighting levels.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A photo sensor with compensation comprising:
   a photo cell for providing a first signal indicative of a light level;
   an environmental sensor configured to provide a second signal indicative of an environmental parameter; and
   a processor responsive to the first signal and the second signal and configured to provide a compensated signal that is indicative of an absolute light level;
   wherein the processor is further configured to determine the compensated signal based at least on one or more of the first signal and the second signal and wherein the processor adjusts the first signal to account for a sensitivity of the photo cell relative to the light level to provide the compensated signal; and
   wherein the processor adjusts the first signal in accordance with a light calibration coefficient and a calibration constant associated respectively with the slope and intercept of a line relating the first signal and the light level when the second signal is constant.

2. The photo sensor of claim 1 wherein the environmental sensor comprises a temperature sensor configured to provide the second signal indicative of an ambient temperature.

3. The photo sensor of claim 2 wherein the processor is further configured to provide the compensated signal dependent on ambient temperature as indicated by the temperature sensor and the light level as indicated by the photo cell.

4. The photo sensor of claim 1 where the processor is further configured to access a look up table to facilitate providing the compensated signal.

5. The photo sensor of claim 4 where the processor accesses the look up table in accordance with an index that depends on one or more of the first signal and the second signal.

6. The photo sensor of claim 1 further comprising an analog to digital converter configured to convert the first signal and the second signal to, respectively, a first digital value and a second digital value.

7. The photo sensor of claim 6 where a range of the first digital value is controlled using a resistive circuit that is selectively configured and coupled to the photo cell to set a range for the first signal.

8. The photo sensor of claim 6 further comprising a variable gain circuit coupled with the analog to digital converter and operative to adjust a voltage range of the first signal.

9. The photo sensor of claim 1 wherein the environmental sensor comprises one or more of a day night sensor, a humidity sensor, and a dust sensor.

10. The photo sensor of claim 1 further comprising a network interface coupled to the processor and configured to exchange information corresponding to the compensated signal with a remote location.

11. A photo sensor with compensation comprising:
    a photo cell for providing a first signal indicative of a light level;
    an environmental sensor configured to provide a second signal indicative of an environmental parameter; and
    a processor responsive to the first signal and the second signal and configured to provide a compensated signal that is indicative of an absolute light level;
    wherein the processor is further configured to calculate the compensated signal based the first signal and the second signal and wherein the processor adjusts the first signal to account for a sensitivity of the photo cell relative to temperature to provide the compensated signal, the temperature indicated by the second signal,
    wherein the processor adjust the first signal in accordance with one or more temperature coefficients associated with a function relating the first signal to the temperature when the light level is constant to provide a temperature compensated signal, and
    wherein the processor adjusts the temperature compensated signal in accordance with a light calibration coefficient to provide the compensated signal that is indicative of the absolute light level.

12. A method of determining parameters for compensation of a photo sensor, the method comprising:
    varying an input light level to the photo sensor while controlling a temperature of the photo sensor to provide first indications of the light level with each of the first indications corresponding to a respective one of a plurality of light levels;
    determining one or more light calibration coefficients based on the first indications of the light level;
    varying the temperature of the photo sensor while controlling the input light level to provide second indications of the light level with each of the second indications corresponding to a respective one of a plurality of temperatures; and
    determining one or more temperature coefficients based on the second indications of the light level, wherein the light calibration coefficients and the temperature coefficients are suitable for use in converting a light level indication from the photo sensor to a compensated signal indicative of an absolute light level.

13. The method of claim 12 further comprising setting up a calibrated light source before the varying the input light level and controlling the temperature at a known value.

14. The method of claim 12 where the determining one or more light calibrations coefficients further comprises determining a light calibration coefficient corresponding to a slope of a line between two or more of the first indications and a light calibration constant corresponding to an intercept of the line.

15. The method of claim 12 further comprising normalizing the second indications in accordance with the second indication obtained at a known temperature corresponding to the controlling the temperature and where the determining the one or more temperature coefficients is based on the second indications as normalized.

16. The method of claim 15 where the one or more temperature coefficients define a temperature calibration equation to facilitate temperature compensation of any indication of a light level.

17. The method of claim 16 where the any indication of a light level as temperature compensated is calibrated to provide an calibrated light level in accordance with the one or more light calibrations coefficients determined as a slope of a line between two or more of the first indications and a light calibration constant corresponding to an intercept of the line.

18. A method of compensating an output of a photo sensor to provide a calibrated light reading comprising:
    obtaining one or more light calibration coefficients and one or more temperature coefficients corresponding to the photo sensor;
    getting a light output indication for the photo sensor and a temperature indication from a temperature sensor; and
    calculating the calibrated light reading based on the one or more temperature coefficients, the one or more light calibration coefficients, the temperature indication, and the light output indication, the calibrated light reading indicative of an absolute light level.

19. The method of claim 18 wherein obtaining one or more light calibration coefficients and one or more temperature coefficients further comprises obtaining one or more light calibration coefficients and one or more temperature coefficients from experimental results.

20. The method of claim 18 wherein calculating the calibrated light reading further comprises calculating a first compensated light output indication based on an equation corresponding to the one or more temperature coefficients.

21. The method of claim 20 wherein calculating the calibrated light reading further comprises converting the temperature indication to a temperature.

22. The method of claim 21 wherein calculating the calibrated light reading further comprises calculating the calibrated light reading based on the first compensated light output indication and the one or more light calibration coefficients.

23. A method of compensating a photo sensor comprising;
providing a first signal indicative of a light level;
providing a second signal indicative of an environmental parameter; and
calculating, responsive to the first signal and the second signal, a compensated signal that is indicative of an absolute light level;
where calculating the compensated signal is based the first signal and the second signal and comprises adjusting the first signal to account for a sensitivity of a photo cell relative to the light level to provide the compensated signal, and
wherein adjusting the first signal comprises adjusting the first signal in accordance with a light calibration coefficient and a calibration constant associated respectively with the slope and intercept of a line relating the first signal and the light level when the second signal is constant.

24. The method of claim 23 wherein calculating further comprises accessing a look up table to facilitate providing the compensated signal.

25. The method of claim 24 wherein accessing the look up table comprises accessing the look up table in accordance with an index that depends on one or more of the first signal and the second signal.

26. The method of claim 23 wherein providing the first signal and providing the second signal further comprises converting the first signal and the second signal to a, respective, first digital value and second digital value.

27. The method of claim 26 where a range of the first digital value is controlled using a resistive circuit that is selectively configured and coupled to a photo sensor to set a range for the first signal.

28. The method of claim 26 where a range of the first digital value is controlled using a variable gain circuit that is selectively configured and coupled to a photo sensor.

29. The method of claim 23 wherein calculating further comprises accessing a look up table at a remote location using a network interface to facilitate providing the compensated signal.

30. A method of compensating a photo sensor comprising:
providing a first signal indicative of a light level;
providing a second signal indicative of an environmental parameter; and
calculating, responsive to the first signal and the second signal, a compensated signal that is indicative of an absolute light level;
wherein calculating the compensated signal is based the first signal and the second signal and comprises adjusting the first signal to account for a sensitivity of a photo cell relative to the light level to provide the compensated signal,
wherein adjusting the first signal comprises adjusting the first signal in accordance with one or more temperature coefficients associated with a function relating the first signal to the temperature when the light level is constant to provide a temperature compensated signal,.
wherein adjusting the first signal comprises adjusting the temperature compensated signal in accordance with a light calibration coefficient to provide the compensated signal that is indicative of the absolute light level.

* * * * *